United States Patent
Xiao et al.

(10) Patent No.: US 12,205,764 B2
(45) Date of Patent: Jan. 21, 2025

(54) SUSPENSION APPARATUS FOR SUPERCONDUCTING MAGNET, SUPERCONDUCTING MAGNET AND MAGNETIC RESONANCE IMAGING DEVICE

(71) Applicant: Siemens Healthcare GmbH, Erlangen (DE)

(72) Inventors: Lei Xiao, Shenzhen (CN); Bu Qing Zhang, Shenyang (CN); Zong Fang Chen, Shenzhen (CN); Edward Wedderburn Kershaw, Oxon (GB); Trevor Bryan Husband, Kidlington (GB); Melanie Rigby, Oxford (GB); Nicholas Mann, Compton (GB)

(73) Assignee: Siemens Healthcare Limited, Camberley (GB)

( * ) Notice: Subject to any disclaimer, the term of this patent is extended or adjusted under 35 U.S.C. 154(b) by 583 days.

(21) Appl. No.: 17/426,085

(22) PCT Filed: Jan. 15, 2020

(86) PCT No.: PCT/EP2020/050890
§ 371 (c)(1),
(2) Date: Jul. 27, 2021

(87) PCT Pub. No.: WO2020/156811
PCT Pub. Date: Aug. 6, 2020

(65) Prior Publication Data
US 2022/0093299 A1   Mar. 24, 2022

(30) Foreign Application Priority Data

Jan. 28, 2019  (CN) .......................... 201910079940.7
Jan. 28, 2019  (CN) .......................... 201920143460.8

(51) Int. Cl.
*H01F 6/04*   (2006.01)
*F17C 3/08*   (2006.01)
(Continued)

(52) U.S. Cl.
CPC ............... *H01F 6/04* (2013.01); *F17C 3/085* (2013.01); *F17C 13/08* (2013.01); *G01R 33/381* (2013.01); *G01R 33/3815* (2013.01)

(58) Field of Classification Search
CPC . H01F 6/04; F17C 3/085; F17C 13/08; G01R 33/381; G01R 33/3815;
(Continued)

(56) References Cited

U.S. PATENT DOCUMENTS 4,325,530 A * 4/1982 Niemann ............... F17C 13/087
62/51.1
4,516,405 A * 5/1985 Laskaris ............... F17C 13/087
62/50.7

(Continued)

FOREIGN PATENT DOCUMENTS

CN   102778660 A   11/2012
CN   203179645     9/2013
(Continued)

OTHER PUBLICATIONS

PCT International Search Report for PCT/EP2020/050890 dated May 4, 2020.

*Primary Examiner* — Monica E Millner
(74) *Attorney, Agent, or Firm* — Banner & Witcoff Ltd.

(57) ABSTRACT

A suspension apparatus for a superconducting magnet, comprising a support tray and at least two suspension assemblies. The support tray has at least one through-hole and comprises at least two mounting parts. The at least two suspension assemblies pass through the support tray via the through-hole. Each of the suspension assemblies is con-
(Continued)

nected to one of the mounting parts. The suspension apparatus is easy to install. Furthermore, a superconducting magnet comprising the suspension apparatus, and a magnetic resonance imaging device, are also provided.

13 Claims, 8 Drawing Sheets

(51) Int. Cl.
*F17C 13/08* (2006.01)
*G01R 33/381* (2006.01)
*G01R 33/3815* (2006.01)

(58) Field of Classification Search
CPC .. F16M 11/04; F16M 13/027; F16M 222/063; F16B 47/00
See application file for complete search history.

(56) References Cited

U.S. PATENT DOCUMENTS

| | | | | |
|---|---|---|---|---|
| 4,848,103 | A * | 7/1989 | Pelc | F17C 13/087 62/51.1 |
| 4,986,078 | A * | 1/1991 | Laskaris | F25D 19/006 62/51.1 |
| 5,083,105 | A * | 1/1992 | Herd | G01R 33/3815 62/51.1 |
| 6,230,502 | B1 * | 5/2001 | Kershaw | F17C 13/087 62/297 |
| 7,049,920 | B2 * | 5/2006 | Yoshino | G01R 33/3806 324/318 |
| 7,646,272 | B1 * | 1/2010 | Schmierer | G01R 33/3815 335/216 |
| 8,028,853 | B2 * | 10/2011 | Hobbs | G01R 33/3815 156/247 |
| 8,393,163 | B2 * | 3/2013 | Mann | G01R 33/3815 62/51.1 |
| 8,511,632 | B2 * | 8/2013 | Derakhshan | G01R 33/3804 62/51.1 |
| 10,415,759 | B2 * | 9/2019 | Zou | F17C 3/085 |
| 2007/0246630 | A1 * | 10/2007 | Dixey | G01R 33/3815 248/323 |
| 2008/0022698 | A1 | 1/2008 | Hobbs et al. | |
| 2008/0295528 | A1 | 12/2008 | Mann et al. | |
| 2009/0279260 | A1 * | 11/2009 | Yu | G01R 33/3815 361/702 |
| 2016/0231398 | A1 * | 8/2016 | Kershaw | G01R 33/3802 |
| 2017/0294256 | A1 * | 10/2017 | Oka | G01R 33/3802 |
| 2018/0024210 | A1 * | 1/2018 | Heid | G01R 33/3815 324/322 |

FOREIGN PATENT DOCUMENTS

| | | |
|---|---|---|
| CN | 104779030 A | 7/2015 |
| CN | 108777206 A | 11/2018 |
| CN | 208157183 | 11/2018 |
| CN | 208607985 U | 3/2019 |
| CN | 209312517 | 8/2019 |
| EP | 0284875 A2 | 10/1988 |
| JP | S5984406 A | 5/1984 |

* cited by examiner

SUSPENSION APPARATUS FOR SUPERCONDUCTING MAGNET, SUPERCONDUCTING MAGNET AND MAGNETIC RESONANCE IMAGING DEVICE

CROSS-REFERENCE TO RELATED APPLICATIONS

The present application is a national stage entry of PCT application no. PCT/EP2020/050890, filed on Jan. 15, 2020, which claims the benefit of the filing date of China patent application no. CN 201910079940.7, filed on Jan. 28, 2019, and China patent application no. CN 201920143460.8, filed on Jan. 28, 2019, the contents of each of which are incorporated herein by reference in their entireties.

TECHNICAL FIELD

The present disclosure relates to a suspension apparatus for a superconducting magnet, in particular a suspension apparatus that is convenient to install, and a superconducting magnet comprising same, as well as a magnetic resonance imaging device.

BACKGROUND

A superconducting magnet mainly comprises a vacuum container and a cryogenic apparatus, with a superconducting coil being disposed in the cryogenic apparatus. The cryogenic apparatus is installed in the vacuum container, and must be disposed in a suspended manner, to avoid conduction heat leakage due to contact with a vacuum container housing at room temperature. The cryogenic apparatus may be suspended in the vacuum container by means of a suspension apparatus. An existing suspension apparatus comprises two fixed members, one fixed member being fixed to the cryogenic apparatus and the other fixed member being fixed to the vacuum container, and the two fixed members being connected to each other via a connecting member in order to accomplish suspension. One suspension apparatus as described above can only provide one suspending force for the cryogenic apparatus. In order to suspend the cryogenic apparatus stably in the vacuum container, it is necessary to provide suspending forces in multiple directions for the cryogenic apparatus by means of multiple suspension apparatuses as described above. Each suspension apparatus must be installed separately, with the result that the process of assembling the superconducting magnet is intricate and installation precision is affected.

SUMMARY

An object of the present disclosure is to provide a suspension apparatus for a superconducting magnet, which is convenient to install.

Another object of the present disclosure is to provide a superconducting magnet, having a suspension apparatus which is convenient to install.

Another object of the present disclosure is to provide a magnetic resonance imaging device, having a superconducting magnet which is easy to assemble.

The present disclosure provides a suspension apparatus for a superconducting magnet, comprising a support tray and at least two suspension assemblies. The support tray has at least one through-hole and comprises at least two mounting parts. The at least two suspension assemblies pass through the support tray via the through-hole. Each of the suspension assemblies is connected to one of the mounting parts.

The suspension apparatus can provide at least two suspending forces for the cryogenic apparatus. Thus, the function of at least two existing suspension apparatuses is realized by one suspension apparatus, and installation can thereby be facilitated.

In another schematic embodiment of the suspension apparatus, the support tray takes the form of a joined-ring body composed of at least two ring shapes. The support tray comprises at least two annular parts corresponding to the at least two ring shapes. One through-hole is provided at the center of the ring shape of each of the annular parts. One of the mounting parts is disposed on each of the annular parts. Each of the suspension assemblies passes through one of the annular parts via one of the through-holes. This structure is simple and easy to machine.

In another schematic embodiment of the suspension apparatus, the support tray is provided with two of the annular parts and two of the mounting parts. A threaded hole runs through each of the mounting parts. The suspension apparatus is provided with two of the suspension assemblies. Each of the suspension assemblies is connected to the mounting part via one of the threaded holes. The two annular parts are arranged in a mirror-image fashion relative to a plane of symmetry. An axis of the threaded hole is arranged at a slant relative to the plane of symmetry. This structure is convenient to install and adjust.

In another schematic embodiment of the suspension apparatus, the threaded hole is disposed in a hole wall of the through-hole, and the axis of the threaded hole can pass through the through-hole. Space can thereby be saved.

In another schematic embodiment of the suspension apparatus, each of the suspension assemblies comprises a tensioning member, a pulling member and a suspension member. The tensioning member is fixed to the mounting part via one of the threaded holes, a fixing position thereof relative to the mounting part being adjustable in a direction parallel to the axis of the threaded hole. The pulling member has a first pulling part and a second pulling part. The pulling member passes through the annular part via one of the through-holes, the first pulling part and the second pulling part being located at two sides of the through-hole respectively. The first pulling part is connected to the tensioning member, and configured to apply to the tensioning member a pulling force in a direction parallel to the axis of the threaded hole. The second pulling part is connected to the suspension member and configured to apply a pulling force to the suspension member. The pulling forces applied to the tensioning member and the suspension member by the pulling member are in opposite directions. This structure is convenient to install and adjust.

In another schematic embodiment of the suspension apparatus, each of the tensioning members comprises a tensioning bolt and an abutment member. The tensioning bolt is connected by screw-thread to one of the mounting parts via the threaded hole. One end of the tensioning bolt is rotatably connected to the abutment member, and a rotation axis overlaps with an axis of the tensioning bolt. The first pulling part is connected to the abutment member. This structure is simple, and is convenient to machine and operate.

In another schematic embodiment of the suspension apparatus, each tensioning member further comprises a lock nut. The lock nut is connected by screw-thread to the tensioning bolt, and can abut the mounting part, in order to prevent loosening during use.

In another schematic embodiment of the suspension apparatus, the pulling member is a rigid pull ring. The first pulling part and the second pulling part are both arc-shaped, and the pulling member further comprises two linear parts, which connect the first pulling part and the second pulling part to enclose a ring. The abutment member has a first arc-shaped end face corresponding to the shape of the first pulling part. The first pulling part abuts the first arc-shaped end face, in order to apply a pulling force to the abutment member. The suspension member has a second arc-shaped end face corresponding to the shape of the second pulling part. The second pulling part abuts the second arc-shaped end face, in order to apply a pulling force to the suspension member. Being acted upon by forces through contact with the arc-shaped end faces, the arc-shaped first pulling part and second pulling part can adapt to slight adjustments to a pulling force direction and reduce tension.

In another schematic embodiment of the suspension apparatus, the abutment member has a blind hole. One end of the tensioning bolt is rotatably inserted in the blind hole. This structure is simple, and is convenient to machine.

In another schematic embodiment of the suspension apparatus, the pulling member is a pull rod. The first pulling part and the second pulling part are located at two ends of the pull rod respectively. The tensioning bolt has a central hole arranged to run through along the axis of the tensioning bolt. The abutment member is disposed at one end of the central hole and forms a spherical-surface sliding fit with the tensioning bolt. The pulling member passes through the tensioning bolt via the central hole, and the first pulling part is connected to the abutment member. This structure can adapt to slight adjustments to a pulling force direction.

In another schematic embodiment of the suspension apparatus, the suspension member has an engagement slot. The pulling member passes through the suspension member along the engagement slot. The suspension assembly further comprises an end washer, which is connected to the second pulling part and forms a spherical-surface sliding fit with the suspension member. The pulling member can move out of the engagement slot in a direction perpendicular to the axis of the threaded hole. This structure can adapt to slight adjustments to a pulling force direction, and facilitates installation.

In another schematic embodiment of the suspension apparatus, the support tray is integrally formed, in order to make the structure more stable.

The present disclosure further provides a superconducting magnet, comprising a vacuum container, a cryogenic apparatus and a suspension apparatus as described above. The vacuum container has an accommodating cavity. The cryogenic apparatus is disposed in the accommodating cavity. The support tray of the suspension apparatus is connected in a fixed manner to an outer surface of the vacuum container. Each of the suspension assemblies passes through the vacuum container and is connected to the cryogenic apparatus. One suspension apparatus of the superconducting magnet can provide at least two suspending forces for the cryogenic apparatus. Thus, the function of at least two existing suspension apparatuses is realized by one suspension apparatus, and installation can thereby be facilitated.

In another schematic embodiment of the superconducting magnet, the superconducting magnet further comprises a bracket. The bracket is connected in a fixed manner to the outer surface of the vacuum container and to the support tray, and is arranged around the support tray. The connection of the support tray can thereby be made more stable.

In another schematic embodiment of the superconducting magnet, the cryogenic apparatus has a connection surface in the form of an outer cylindrical surface. The suspension apparatus is provided with two of the suspension assemblies, which are arranged in a mirror-image fashion with respect to a first plane perpendicular to an axis of the connection surface, in order to facilitate the balancing of suspending forces.

In another schematic embodiment of the superconducting magnet, the superconducting magnet is provided with four of the suspension apparatuses. Two of the suspension apparatuses form a first suspension apparatus set, and the other two of the suspension apparatuses form a second suspension apparatus set. The first suspension apparatus set and the second suspension apparatus set are arranged in a mirror-image fashion relative to a second plane in which the axis of the connection surface lies. The two suspension apparatuses of the first suspension apparatus set are arranged in a mirror-image fashion relative to a third plane in which the axis of the connection surface lies. The second plane is perpendicular to the third plane. Thus, the four suspension apparatuses can achieve the balancing of suspending forces more easily.

The present disclosure further provides a magnetic resonance imaging device, comprising the superconducting magnet described above. One suspension apparatus of the superconducting magnet can provide at least two suspending forces for the cryogenic apparatus. Thus, the function of at least two existing suspension apparatuses is realized by one suspension apparatus, and installation can thereby be facilitated.

DESCRIPTION OF THE ACCOMPANYING DRAWINGS

The accompanying drawings below merely illustrate and explain the present disclosure schematically, without limiting the scope thereof.

Figure 1:
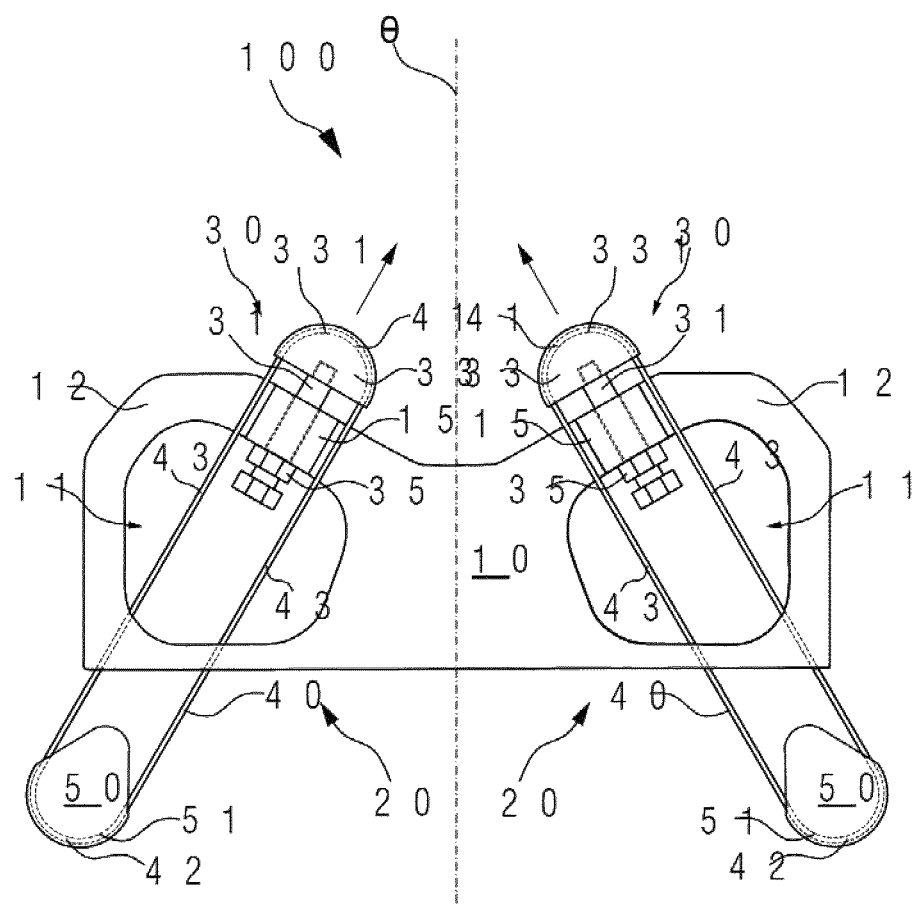
FIG. 1 is a structural schematic diagram of an exemplary schematic embodiment of a suspension apparatus for a superconducting magnet.

KEY TO LABELS 100 suspension apparatus
10 support tray
11 through-hole
12 annular part
15 mounting part
151 threaded hole 20 suspension assembly
30 tensioning member
31 tensioning bolt
311 central hole
33 abutment member
331 first arc-shaped end face
332 blind hole
35 lock nut
40 pulling member
41 first pulling part
42 second pulling part
43 linear part
50 suspension member
51 second arc-shaped end face
52 engagement slot
60 end washer
200 vacuum container
201 accommodating cavity
300 cryogenic apparatus
301 connection surface
400 bracket
α first plane
β second plane
δ third plane
θ plane of symmetry
γ axis of connection surface

DETAILED DESCRIPTION

To enable clearer understanding of the technical features, objectives and effects of the disclosure, particular embodiments of the present disclosure are now explained with reference to the accompanying drawings, in which identical labels indicate structurally identical components or components with similar structures but identical functions.

As used herein, "schematic" means "serving as an instance, example or illustration". No drawing or embodiment described herein as "schematic" should be interpreted as a more preferred or more advantageous technical solution.

In this text, "first" and "second", etc. do not indicate order or degree of importance, etc., merely being used to indicate a distinction between parts, to facilitate document descriptions.

To make the drawings appear uncluttered, only those parts relevant to the present disclosure are shown schematically in the drawings; they do not represent the actual structure thereof as a product.

Figure 2:
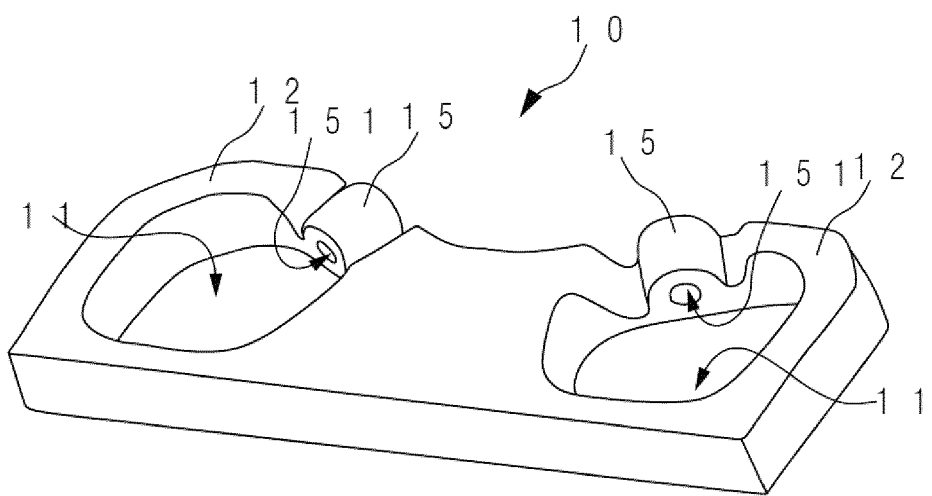
FIG. 2 is a structural schematic diagram of the support tray of the suspension apparatus shown in FIG. 1.

FIG. 1 is a structural schematic diagram of a schematic embodiment of a suspension apparatus for a superconducting magnet. As shown in FIG. 1, the suspension apparatus 100 for a superconducting magnet comprises a support tray 10 and two suspension assemblies 20. FIG. 2 is a structural schematic diagram of the support tray of the suspension apparatus shown in FIG. 1. As shown in FIGS. 1 and 2, the support tray 10 takes the form of a joined-ring body composed of two ring shapes. The support tray 10 comprises two annular parts 12 corresponding to the two ring shapes, with a mounting part 15 being disposed on each annular part 12. In this schematic embodiment, the two annular parts 12 are arranged in a mirror-image fashion relative to a plane of symmetry θ, the mirror-image arrangement being more favourable for the balancing of forces borne, but there is no restriction to this. A through-hole 11 is provided at the center of the ring shape of each annular part 12. Each suspension assembly 20 passes through one annular part 12 via one through-hole 11; one end thereof, passing out of the through-hole 11, is connected to one mounting part 15, another end being used for connecting a cryogenic apparatus of a superconducting magnet.

In this schematic embodiment, the support tray 10 is provided with two annular parts 12 and two mounting parts 15, and the suspension apparatus is provided with two suspension assemblies 20. However, there is no restriction to this; in other schematic embodiments, only one annular part 12 may be provided, i.e. the support tray 10 only has one through-hole 11, and two or more suspension assemblies 20 may pass through this one through-hole 11 at the same time. In other schematic embodiments, the quantities of mounting part(s) 15 and suspension assembly(assemblies) 20 may be adjusted as required, and for example may be greater than two.

In this schematic embodiment, the support tray 10 takes the form of a joined-ring body, but is not restricted to this; in other schematic embodiments, the shape thereof may be adjusted as required.

In this schematic embodiment, a threaded hole 151 runs through each mounting part 15. Each suspension assembly 20 is connected to the mounting part 15 via one threaded hole 151. An axis of the threaded hole 151 is arranged at a slant relative to the plane of symmetry θ; the angle of slant thereof may be adjusted as required. This structure is convenient to install and adjust. However, there is no restriction to this; in other schematic embodiments, the suspension assembly 20 may be connected to the mounting part 15 in a different way.

In this schematic embodiment, each suspension assembly 20 comprises a tensioning member 30, a pulling member 40 and a suspension member 50. The tensioning member 30 is fixed to the mounting part 15 via one threaded hole 151, and a fixing position thereof relative to the mounting part 15 can be adjusted in a direction parallel to the axis of the threaded hole 151. The pulling member 40 has a first pulling part 41 and a second pulling part 42. The pulling member 40 passes through the annular part 12 via one through-hole 11, with the first pulling part 41 and the second pulling part 42 being located at two sides of the through-hole 11 respectively. The first pulling part 41 is connected to the tensioning member 30, and configured to apply to the tensioning member 30 a pulling force in a direction parallel to the axis of the threaded hole 151. The second pulling part 42 is connected to the suspension member 50, and configured to apply a pulling force to the suspension member 50. The pulling forces applied by the pulling member 40 to the tensioning member 30 and the suspension member 50 are in opposite directions, to facilitate the balancing of forces. This structure is convenient to install and adjust. However, there is no restriction to this.

Figure 7:
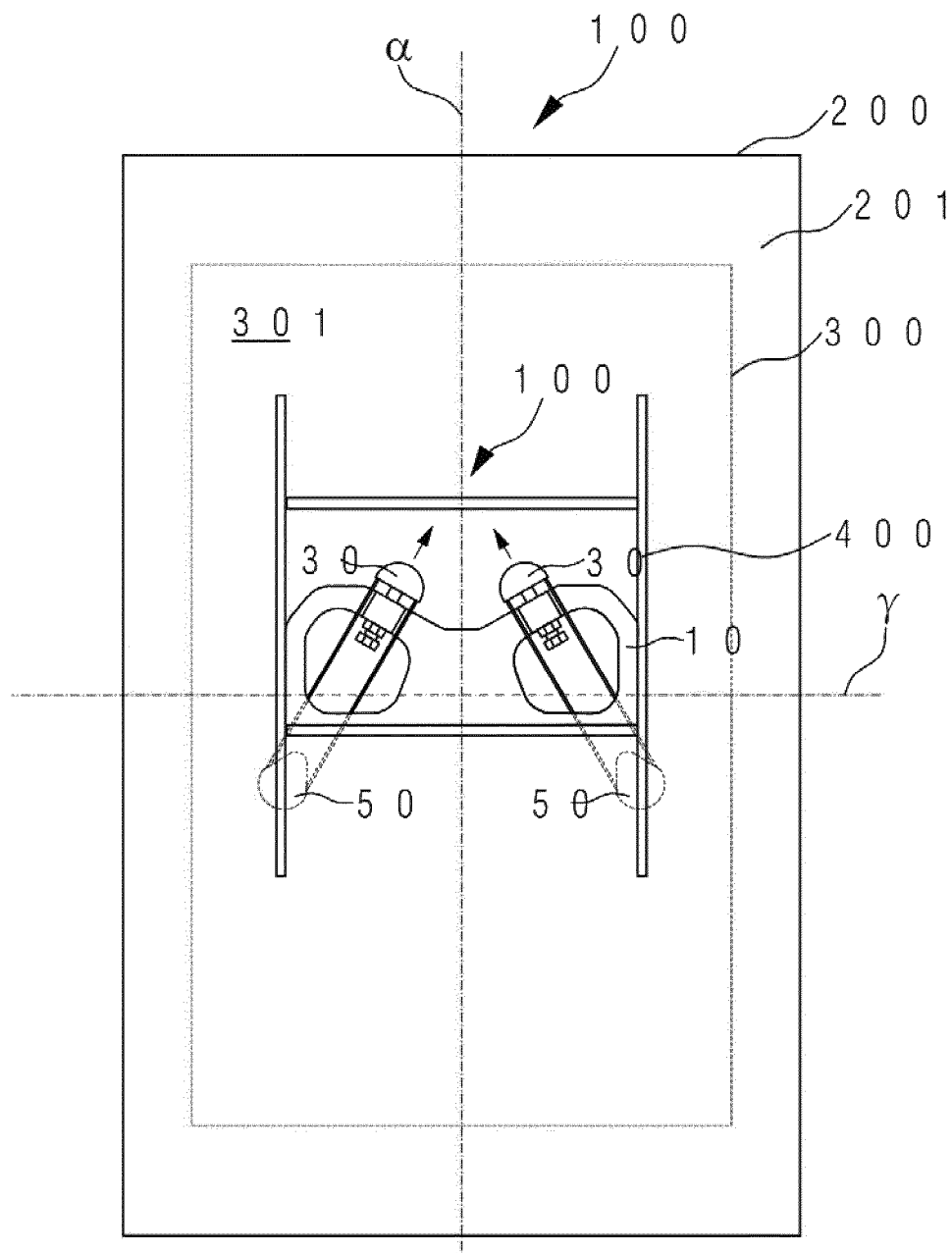
FIG. 7 is a structural schematic diagram intended to illustrate an exemplary schematic embodiment of a superconducting magnet.

Referring to FIG. 7, when the suspension apparatus 100 is in use, the support tray 10 is connected in a fixed manner to a vacuum container 200, and the suspension members 50 of the two suspension assemblies 20 are connected in a fixed manner to a cryogenic apparatus 300. By adjusting the fixing position of the tensioning member 30 on the support tray 10, the degree of tensioning of the pulling member 40 can be adjusted, in order to suspend the cryogenic apparatus 300. Each suspension apparatus 100 may provide two suspending forces for the cryogenic apparatus 300 via one pair of suspension assemblies 20. Thus, the function of two existing suspension apparatuses is realized by one suspension apparatus 100, and installation can thereby be facilitated.

In a schematic embodiment, the threaded hole 151 is disposed in a hole wall of the through-hole 11, and the axis of the threaded hole 151 can pass through the through-hole 11. Space can thereby be saved.

Figure 3:
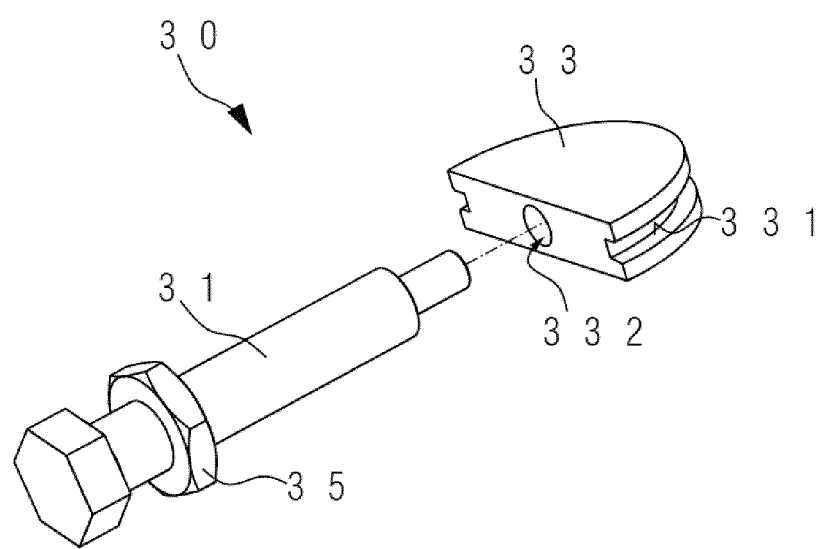
FIG. 3 is a schematic exploded view of the tensioning member of the suspension apparatus shown in FIG. 1.

FIG. 3 is a schematic exploded view of the tensioning member of the suspension apparatus shown in FIG. 1. As shown in FIG. 3, in this schematic embodiment, each tensioning member 30 comprises a tensioning bolt 31 and an abutment member 33. The tensioning bolt 31 is connected by screw-thread to one mounting part 15 via the threaded hole 151. One end of the tensioning bolt 31 is rotatably connected to the abutment member 33, and a rotation axis overlaps with an axis of the tensioning bolt 31. The first pulling part 41 is connected to the abutment member 33. Thus, the fixing position of the tensioning member 30 relative to the mounting part 15 can be adjusted by turning the tensioning bolt 31, without affecting the angle of the abutment member 33. This structure is simple, and is convenient to machine and operate.

In a schematic embodiment, each tensioning member 30 further comprises a lock nut 35. The lock nut 35 is connected by screw-thread to the tensioning bolt 31, and can abut the mounting part 15. Thus, once the position of the tensioning bolt 31 has been chosen, the position of the tensioning bolt 31 relative to the mounting part 15 can be locked by means of the lock nut 35, preventing loosening during use.

In this schematic embodiment, the pulling member 40 is a rigid pull ring. The first pulling part 41 and the second pulling part 42 are both arc-shaped. The pulling member 40 further comprises two linear parts 43, which connect the first pulling part 41 and the second pulling part 42 to enclose a ring in the shape of an athletic track. The abutment member 33 has a first arc-shaped end face 331 corresponding to the shape of the first pulling part 41. The first pulling part 41 abuts the first arc-shaped end face 331, in order to apply a pulling force to the abutment member 33. The suspension member 50 has a second arc-shaped end face 51 corresponding to the shape of the second pulling part 42. The second pulling part 42 abuts the second arc-shaped end face 51, in order to apply a pulling force to the suspension member 50. Being acted upon by forces through contact with the arc-shaped end faces, the arc-shaped first pulling part 41 and second pulling part 42 can adapt to slight adjustments to a pulling force direction and reduce tension.

As shown in FIG. 3, in a schematic embodiment, the abutment member 33 has a blind hole 332. One end of the tensioning bolt 31 is rotatably inserted in the blind hole 332. This structure is simple, and is convenient to machine.

Figure 4:
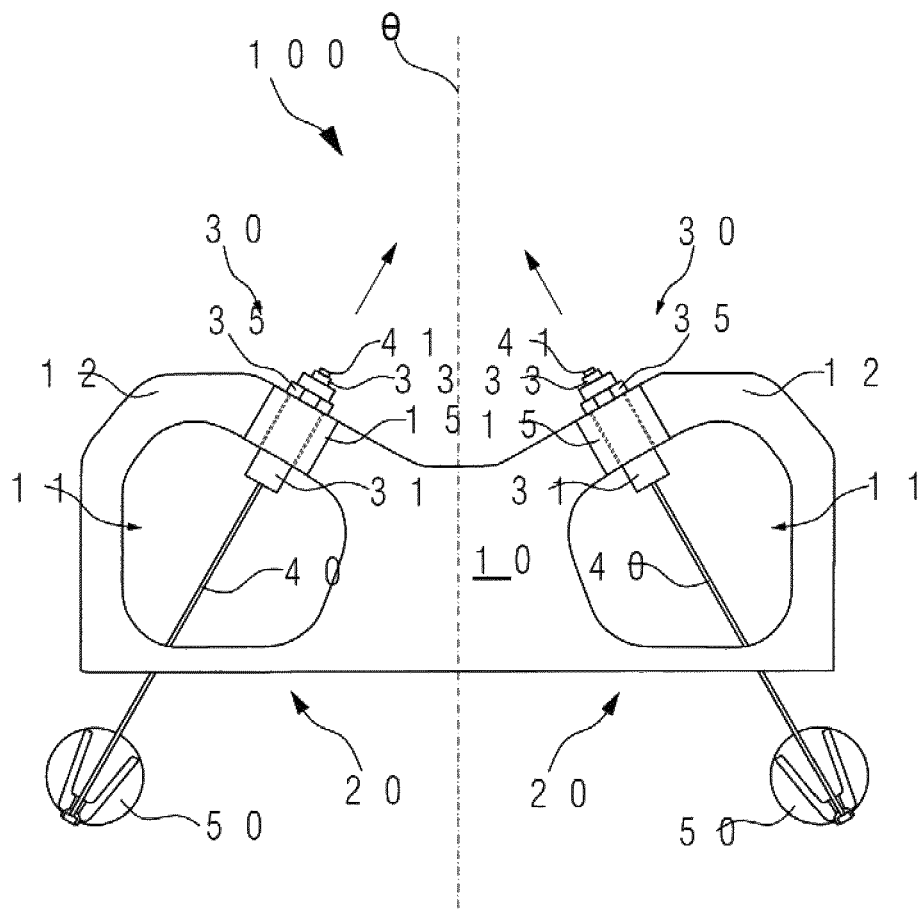
FIG. 4 is a structural schematic diagram of another exemplary schematic embodiment of a suspension apparatus for a superconducting magnet.

FIG. 4 is a structural schematic diagram of another schematic embodiment of a suspension apparatus for a superconducting magnet. The identical features shared by the suspension apparatus of this schematic embodiment and the suspension apparatus shown in FIG. 1 are not repeated here; the structures of the suspension apparatus of this schematic embodiment which differ from the suspension apparatus shown in FIG. 1 are described below.

Figure 5:
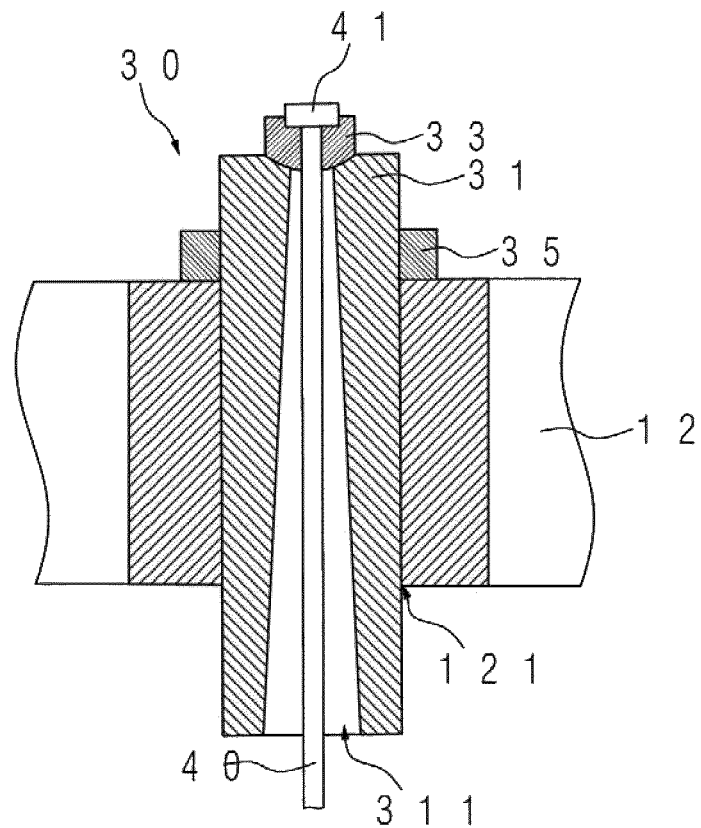
FIG. 5 is intended to illustrate a tensioning member of the suspension apparatus shown in FIG. 4.

In this schematic embodiment, the pulling member 40 is a pull rod. The first pulling part 41 and second pulling part 42 are located at two ends of the pull rod respectively. As shown in FIG. 5, the tensioning bolt 31 has a central hole 311 arranged to run through along the axis of the tensioning bolt. The abutment member 33 is disposed at one end of the central hole 311 and forms a spherical-surface sliding fit with the tensioning bolt 31, in order to adapt to slight adjustments to a pulling force direction. The pulling member 40 passes through the tensioning bolt 31 via the central hole 311, and the first pulling part 41 is connected to the abutment member 33.

Figure 6:
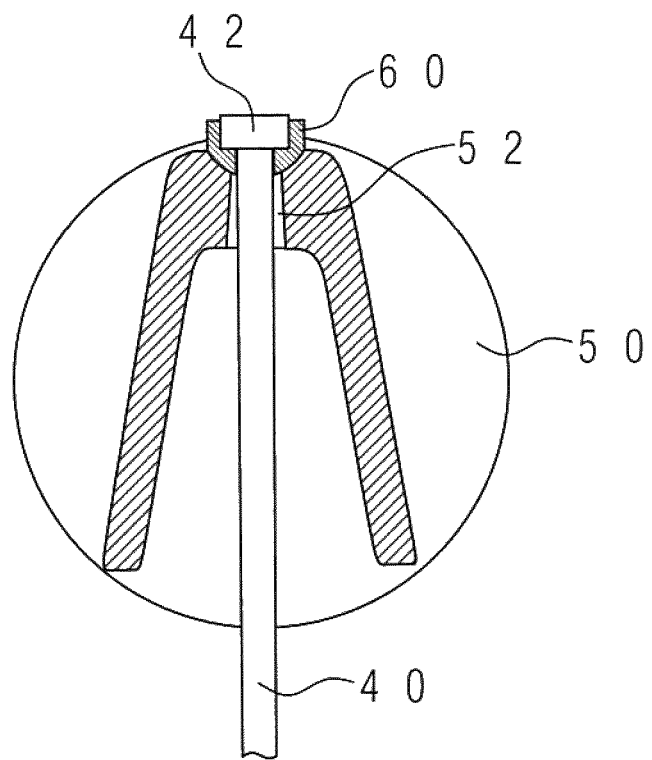
FIG. 6 is intended to illustrate a suspension member of the suspension apparatus shown in FIG. 4.

As shown in FIG. 6, in this schematic embodiment, the suspension member 50 has an engagement slot 52. The pulling member 40 passes through the suspension member 50 along the engagement slot 52. The suspension assembly 20 further comprises an end washer 60, which is connected to the second pulling part 42 and forms a spherical-surface sliding fit with the suspension member 50, in order to adapt to slight adjustments to a pulling force direction. The pulling member 40 can move out of the engagement slot 52 in a direction perpendicular to the axis of the threaded hole 151; installation can thereby be facilitated.

In a schematic embodiment, the support tray 10 is integrally formed, so the structure thereof is more stable.

Figure 8:
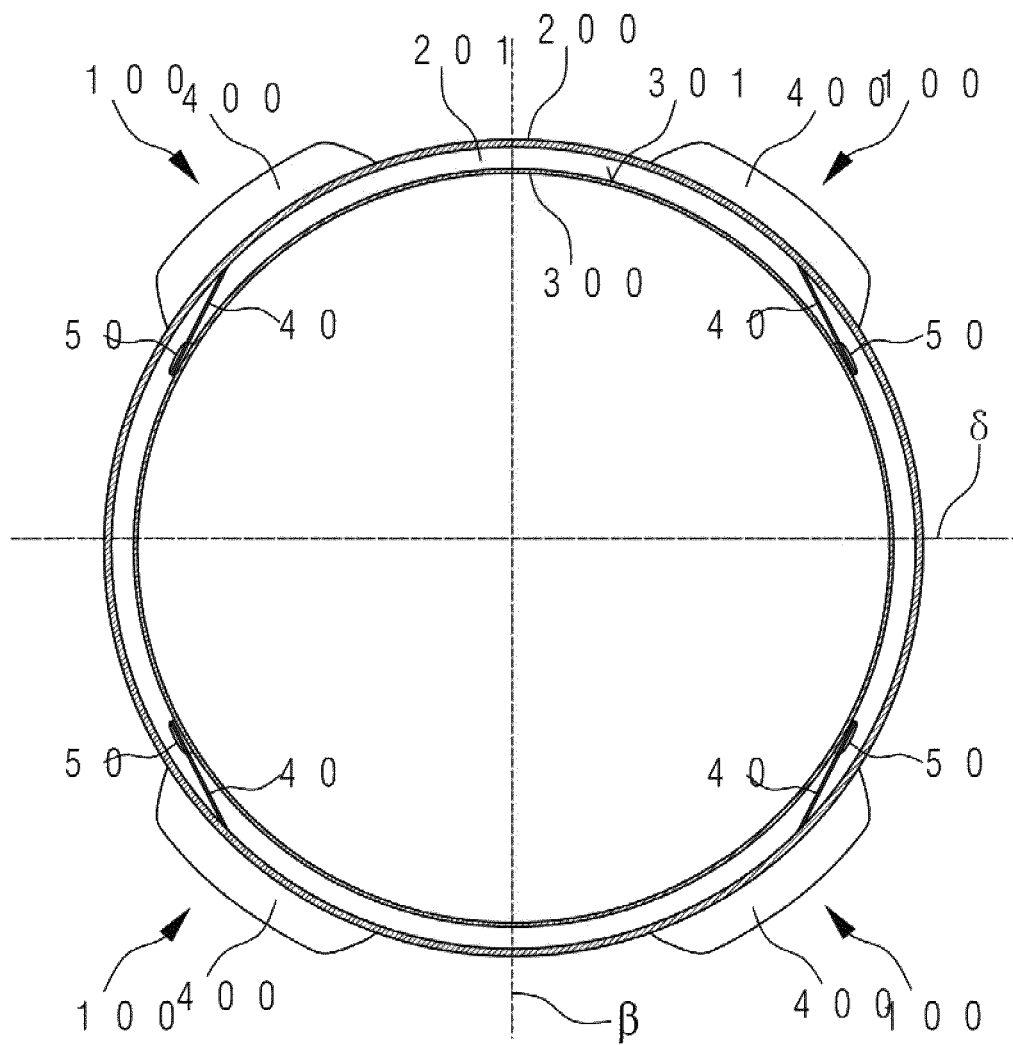
FIG. 8 is a structural schematic diagram, shown along an axis γ of a connection surface, intended to illustrate the superconducting magnet shown in FIG. 7.

FIG. 7 is a structural schematic diagram intended to illustrate a schematic embodiment of a superconducting magnet. FIG. 8 is a structural schematic diagram, shown along an axis γ of a connection surface, intended to illustrate the superconducting magnet shown in FIG. 7. As shown in FIGS. 7 and 8, the superconducting magnet comprises a vacuum container 200, a cryogenic apparatus 300 and a suspension apparatus 100 as shown in FIG. 1. The vacuum container 200 has an accommodating cavity 201. The cryogenic apparatus 300 is disposed in the accommodating cavity 201. The support tray 10 of the suspension apparatus 100 is connected in a fixed manner to an outer surface of the vacuum container 200. Each suspension assembly 20 passes through the vacuum container 200 and the suspension member 50 thereof is connected in a fixed manner to the cryogenic apparatus 300. By adjusting the fixing position of the tensioning member 30 on the support tray 10, the degree of tensioning of the pulling member 40 can be adjusted, in order to suspend the cryogenic apparatus 300. One suspension apparatus 100 of the superconducting magnet may provide two suspending forces for the cryogenic apparatus 300 via one pair of suspension assemblies 20. Thus, the function of two existing suspension apparatuses is realized by one suspension apparatus 100, and installation can thereby be facilitated.

In other schematic embodiments, the suspension apparatus 100 could also be the suspension apparatus 100 shown in FIG. 4.

In a schematic embodiment, the superconducting magnet further comprises a bracket 400. The bracket 400 is connected in a fixed manner to the outer surface of the vacuum container 200 and to the support tray 10, and is arranged around the support tray 10. The connection of the support tray 10 can thereby be made more stable.

In a schematic embodiment, the cryogenic apparatus 300 has a connection surface 301 in the form of an outer cylindrical surface. The two suspension assemblies 20 are arranged in a mirror-image fashion with respect to a first plane α perpendicular to the axis γ of the connection surface; the plane of symmetry θ overlaps with the first plane α. Thus, the resultant force of the two suspending forces applied to the cryogenic apparatus 300 by each suspension apparatus 100 is perpendicular to the axial direction of the connection surface 301, in order to facilitate the balancing of suspending forces.

As shown in FIG. 8, in a schematic embodiment, the superconducting magnet is provided with four suspension apparatuses 100. Two of the suspension apparatuses 100 form a first suspension apparatus set, and the other two suspension apparatuses 100 form a second suspension apparatus set. The first suspension apparatus set and second suspension apparatus set are arranged in a mirror-image fashion relative to a second plane β in which the axis γ of the connection surface lies. The two suspension apparatuses 100 of the first suspension apparatus set are arranged in a mirror-image fashion relative to a third plane δ in which the axis γ of the connection surface lies. The second plane β is perpendicular to the third plane δ. Thus, the four suspension apparatuses 100 can achieve the balancing of suspending forces more easily.

The present disclosure further provides a magnetic resonance imaging device, comprising the superconducting magnet described above. One suspension apparatus 100 of the superconducting magnet may provide two suspending forces for the cryogenic apparatus 300 via one pair of suspension assemblies 20. Thus, the function of two existing suspension apparatuses is realized by one suspension apparatus 100, and installation can thereby be facilitated.

It should be understood that although the description herein is based on various embodiments, it is by no means the case that each embodiment contains just one independent technical solution. Such a method of presentation is adopted herein purely for the sake of clarity. Those skilled in the art should consider the description in its entirety. The technical solutions in the various embodiments could also be suitably combined to form other embodiments capable of being understood by those skilled in the art.

The series of detailed explanations set out above are merely particular explanations of feasible embodiments of the present disclosure, which are not intended to limit the scope of protection thereof. All equivalent embodiments or changes made without departing from the artistic spirit of the present disclosure, such as combinations, divisions or repetitions of features, shall be included in the scope of protection of the present disclosure.

The invention claimed is:

1. A suspension apparatus for a superconducting magnet, comprising:
   a support tray comprising two through holes and two mounting parts; and
   two suspension assemblies passing through the support tray via a respective one of the two through holes, each one of the two suspension assemblies being connected to a respective one of the at least two mounting parts,
   wherein the support tray comprises a joined-ring body composed of two ring shapes, the support tray comprising two annular parts corresponding to the two ring shapes, with each one of the two through-holes being provided at a center of each respective ring shape of the two annular parts,
   wherein each one of the two mounting parts is disposed on a respective one of the two annular parts, and
   wherein each one of the two suspension assemblies passes through a respective one of the two annular parts via a respective one of the two through-holes.

2. The suspension apparatus as claimed in claim 1, wherein:
   a threaded hole runs through each respective one of the two mounting parts,
   the suspension apparatus is provided with the two suspension assemblies, each of the two suspension assemblies being connected to a respective mounting part via a respective threaded hole, and
   the two annular parts are arranged in a mirror-image fashion relative to a plane of symmetry, and
   an axis of each respective threaded hole is arranged at an angle relative to the plane of symmetry.

3. The suspension apparatus as claimed in claim 2, wherein each respective threaded hole is disposed in a wall of a respective one of the two through holes, and each respective threaded hole is configured to have an axis that passes through a respective one of the two through holes.

4. The suspension apparatus as claimed in claim 2, wherein each of the two suspension assemblies comprises:
   a tensioning member fixed to a respective one of the two mounting parts via a respective threaded hole, a fixing position thereof relative to a respective one of the two mounting parts being adjustable in a direction parallel to the axis of the respective threaded hole;
   a pulling member having a first pulling part and a second pulling part, the pulling member passing through a respective one of the two annular parts via a respective one of the two through-holes, the first pulling part and the second pulling part being respectively located at two sides of a respective one of the two through holes, and the first pulling part being connected to the tensioning member and configured to apply to the tensioning member a pulling force in a direction parallel to the axis of a respective threaded hole; and
   a suspension member, the second pulling part being connected to the suspension member and configured to apply a pulling force to the suspension member,
   wherein the pulling forces applied to the tensioning member and the suspension member by the pulling member are in opposite directions.

5. The suspension apparatus as claimed in claim 4, wherein each tensioning member comprises:
   a tensioning bolt connected by screw-thread to a respective one of the two mounting parts via a respective threaded hole; and
   an abutment member, one end of the tensioning bolt being rotatably connected to the abutment member and having a rotation axis overlapping with an axis of the tensioning bolt, the first pulling part being connected to the abutment member.

6. The suspension apparatus as claimed in claim 5, wherein:
   the pulling member comprises a rigid pull ring, the first pulling part and the second pulling part are both arc-shaped, and the pulling member further comprises two linear parts, which connect the first pulling part and the second pulling part to form a ring,
   the abutment member has a first arc-shaped end face corresponding to a shape of the first pulling part, and the first pulling part abuts the first arc-shaped end face to apply a pulling force to the abutment member,
   the suspension member has a second arc-shaped end face corresponding to a shape of the second pulling part, and the second pulling part abuts the second arc-shaped end face to apply a pulling force to the suspension member.

7. The suspension apparatus as claimed in claim 5, wherein:
   the pulling member comprises a pull rod, the first pulling part and the second pulling part being located at two ends of the pull rod, respectively,
   the tensioning bolt has a central hole arranged to run along the axis of the tensioning bolt, and the abutment member is disposed at one end of the central hole and forms a spherical-surface sliding fit with the tensioning bolt,
   the pulling member passes through the tensioning bolt via the central hole, and
   the first pulling part is connected to the abutment member.

8. The suspension apparatus as claimed in claim 7, wherein:

the suspension member has an engagement slot, the pulling member passing through the suspension member along the engagement slot, the suspension assembly further comprises an end washer, which is connected to the second pulling part and forms a spherical-surface sliding fit with the suspension member, and the pulling member is configured to move out of the engagement slot in a direction perpendicular to the axis of the threaded hole.

9. The suspension apparatus as claimed in claim 1, characterized wherein the support tray is integrally formed.

10. A superconducting magnet, comprising:
   a vacuum container having an accommodating cavity;
   a cryogenic apparatus disposed in the accommodating cavity; and
   a suspension apparatus comprising:
      a support tray comprising two through holes and two mounting parts; and
      two suspension assemblies passing through the support tray via a respective one of the two through holes, each one of the two suspension assemblies being connected to a respective one of the two mounting parts,
   wherein the support tray is connected in a fixed manner to an outer surface of the vacuum container, and
   wherein each one of the two suspension assemblies passes through the vacuum container and is connected to the cryogenic apparatus.

11. The superconducting magnet as claimed in claim 10, further comprising:
   a bracket connected in a fixed manner to the outer surface of the vacuum container and to the support tray, the bracket being arranged around the support tray.

12. The superconducting magnet as claimed in claim 10, wherein the cryogenic apparatus has a connection surface in a form of an outer cylindrical surface, and
   wherein the suspension apparatus is provided with the two suspension assemblies, which are arranged in a mirror-image fashion with respect to a first plane perpendicular to an axis of the connection surface.

13. The superconducting magnet as claimed in claim 12, wherein:
   the superconducting magnet comprises four of the suspension apparatuses,
   two of the four suspension apparatuses form a first suspension apparatus set, and the other two of the four suspension apparatuses form a second suspension apparatus set,
   the first suspension apparatus set and the second suspension apparatus set are arranged in a mirror-image fashion relative to a second plane in which the axis of the connection surface lies, and
   the two suspension apparatuses of the first suspension apparatus set are arranged in a mirror-image fashion relative to a third plane in which the axis of the connection surface lies, the second plane being perpendicular to the third plane.

* * * * *